United States Patent
Hirashima

(10) Patent No.: US 11,769,535 B2
(45) Date of Patent: Sep. 26, 2023

(54) SEMICONDUCTOR MEMORY DEVICE

(71) Applicant: KIOXIA CORPORATION, Tokyo (JP)

(72) Inventor: Yasuhiro Hirashima, Kawasaki Kanagawa (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/681,592

(22) Filed: Feb. 25, 2022

(65) Prior Publication Data

US 2023/0078945 A1 Mar. 16, 2023

(30) Foreign Application Priority Data

Sep. 15, 2021 (JP) .................................. 2021-150473

(51) Int. Cl.
*G11C 7/10* (2006.01)
*G11C 8/06* (2006.01)

(52) U.S. Cl.
CPC ............ *G11C 7/1063* (2013.01); *G11C 7/109* (2013.01); *G11C 7/1057* (2013.01); *G11C 8/06* (2013.01); *G11C 2207/2254* (2013.01)

(58) Field of Classification Search
CPC ..... G11C 7/1063; G11C 7/1057; G11C 7/109; G11C 8/06; G11C 2207/2254
See application file for complete search history.

(56) References Cited

U.S. PATENT DOCUMENTS

| | | | | |
|---|---|---|---|---|
| 7,773,440 B2* | 8/2010 | Kim | ..................... | G11C 7/1072 365/201 |
| 7,839,159 B2* | 11/2010 | Nakamura | .......... | H04L 25/0278 324/755.07 |
| 9,520,164 B1* | 12/2016 | Yamamoto | .......... | G11C 7/1057 |
| 10,121,549 B2 | 11/2018 | Yanagidaira | | |
| 10,187,062 B1* | 1/2019 | Shimizu | ............... | G11C 29/028 |
| 2018/0076983 A1 | 3/2018 | Yamamoto et al. | | |
| 2019/0334505 A1 | 10/2019 | Gans | | |

FOREIGN PATENT DOCUMENTS

| | | |
|---|---|---|
| JP | 4916699 B2 | 4/2012 |
| JP | 2018-045743 A | 3/2018 |
| JP | 6640677 B2 | 2/2020 |

* cited by examiner

*Primary Examiner* — Son L Mai

(74) *Attorney, Agent, or Firm* — Kim & Stewart LLP

(57) ABSTRACT

A semiconductor memory device includes a memory cell array, first and second pads, an interface circuit connected to the first pad and configured to transmit data input through the first pad to the memory cell array and output data received from the memory cell array through the first pad, a ZQ calibration circuit that is connected to the second pad and executes a ZQ calibration to generate a ZQ calibration value, and a sequencer configured to control the ZQ calibration circuit to apply the ZQ calibration value to the interface circuit. A command set is input through the first pad after reading data from the memory cell array to cause the interface circuit to output the data read from the memory cell array, and the ZQ calibration circuit executes the ZQ calibration after the command set is input and before the data is output through the first pad.

20 Claims, 13 Drawing Sheets

FIG. 6

|  |  | 27ra | 27rb | 27rc | 27rd | 27re | 27rf | 27rg | COMBINED RESISTANCE |
|---|---|---|---|---|---|---|---|---|---|
| CASE 1 | RESISTANCE VALUE (VARIATION 0%) | 30400 | 15200 | 7600 | 3800 | 1900 | 950 | 475 | 301.0 |
|  | NMOS ON/OFF | ON |  | ON |  |  |  | ON |  |
| CASE 2 | RESISTANCE VALUE (VARIATION +25%) | 38000 | 19000 | 9500 | 4750 | 2375 | 1187.5 | 593.75 | 299.2 |
|  | NMOS ON/OFF | ON | ON | ON | ON | ON | ON | ON |  |
| CASE 3 | RESISTANCE VALUE (VARIATION -25%) | 22800 | 11400 | 5700 | 2850 | 1425 | 712.5 | 356.25 | 300.0 |
|  | NMOS ON/OFF |  |  | ON | ON |  |  | ON |  |

SEMICONDUCTOR MEMORY DEVICE

CROSS-REFERENCE TO RELATED APPLICATION

This application is based upon and claims the benefit of priority from Japanese Patent Application No. 2021-150473, filed Sep. 15, 2021, the entire contents of which are incorporated herein by reference.

FIELD

Embodiments described herein relate generally to a semiconductor memory device.

BACKGROUND

As an example of a semiconductor memory device, a NAND flash memory is known.

DESCRIPTION OF THE DRAWINGS

FIG. 6 is a diagram illustrating a use condition of the on-chip resistance circuit.

DETAILED DESCRIPTION

Figure 1:
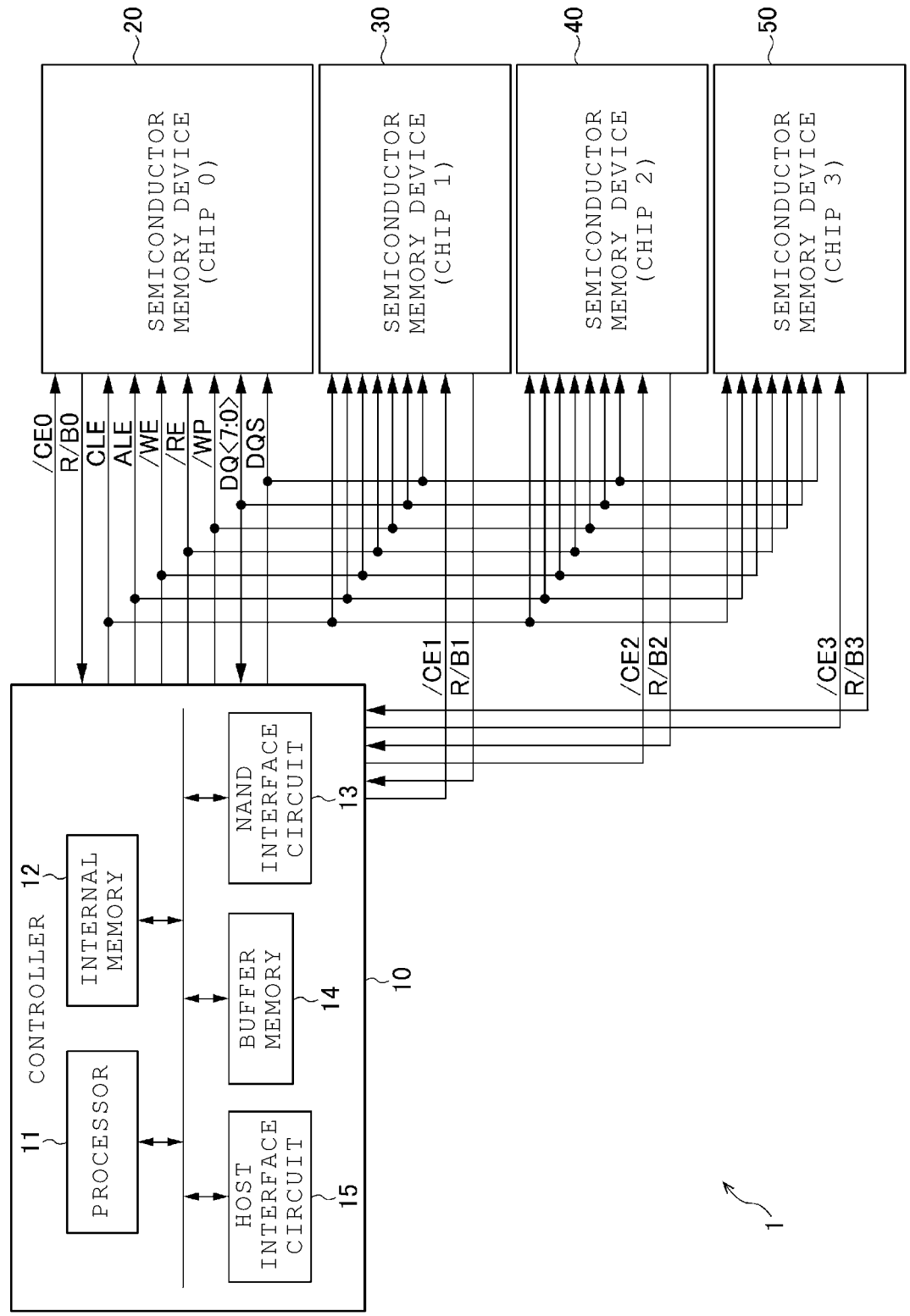
FIG. 1 is a block diagram illustrating a configuration of a memory system according to a first embodiment.

Embodiments provide a semiconductor memory device capable of reducing a period of time required for a ZQ calibration operation.

In general, according to one embodiment, a semiconductor memory device includes: a memory cell array; a first pad; an interface circuit that is connected to the first pad and configured to transmit data input through the first pad to the memory cell array and output data received from the memory cell array through the first pad; a second pad that is different from the first pad; a ZQ calibration circuit that is connected to the second pad and executes a ZQ calibration to generate a ZQ calibration value; and a sequencer configured to control the ZQ calibration circuit to apply the ZQ calibration value to the interface circuit. In the semiconductor memory device, a command set is input through the first pad after reading data from the memory cell array to cause the interface circuit to output the data read from the memory cell array, and the ZQ calibration circuit executes the ZQ calibration after the command set is input and before the data is output through the first pad.

Hereinafter, an embodiment will be described with reference to the accompanying drawings. For easy understanding of the description, in the drawings, the same components are represented by the same reference numerals, and the description thereof will not be repeated.

In the following description, a signal $X<m:0>$ (m represents a natural number) is an (m+1)-bit signal and represents a set of signals $X<0>$, $X<1>$, ..., and $X<m>$ each of which is a one-bit signal. In addition, a component $Y<m:0>$ represents a set of components $Y<0>$, $Y<1>$, ..., and $Y<m>$ one-to-one corresponding to an input or an output of the signal $X<m:0>$.

1. First Embodiment

A semiconductor memory device according to a first embodiment will be described. The semiconductor memory device according to the first embodiment is, for example, a NAND flash memory.

1.1 Regarding Configuration

1.1.1 Overall Configuration of Memory System

An overall configuration of a memory system according to a first embodiment will be described with reference to FIG. 1. The memory system 1 communicates with, for example, an external host apparatus (not illustrated). The memory system 1 stores data transmitted from the host apparatus. The memory system 1 also transmits the stored data to the host apparatus.

As illustrated in FIG. 1, the memory system 1 includes a controller 10 and a plurality of semiconductor memory devices 20, 30, 40, and 50. The memory system 1 is provided in, for example, one package. The controller 10 receives a command from the host apparatus and controls the semiconductor memory devices 20, 30, 40, and 50 based on the received command. Specifically, the controller 10 writes data instructed to be written by the host apparatus into the semiconductor memory devices 20, 30, 40, and 50. The controller 10 reads data instructed to be read by the host apparatus from the semiconductor memory devices 20, 30, 40, and 50, and transmits the read data to the host apparatus. The controller 10 is connected to the semiconductor memory devices 20, 30, 40, and 50 via a NAND bus.

Each of the semiconductor memory devices 20, 30, 40, and 50 includes a plurality of memory cell arrays and stores data, for example, in a nonvolatile manner. However, the present disclosure is not limited to this example, and the memory cell array may store data in a volatile manner. Each of the semiconductor memory devices 20, 30, 40, and 50 is a semiconductor chip that is uniquely identifiable, for example, by being assigned with a chip address in advance.

Each of the semiconductor memory devices 20, 30, 40, and 50 is instructed to operate independently by the controller 10.

In the following description, the semiconductor memory devices 20, 30, 40, and 50 may be referred to as chips 0, 1, 2, and 3, respectively. In addition, FIG. 1 illustrates an example where the four chips 0, 1, 2, and 3 are connected to the controller 10. The number of chips is not limited to four, and any number of chips may be connected to the controller 10.

The same type of signals are transmitted and received by a NAND bus connected to each of the semiconductor memory devices 20, 30, 40, and 50. The NAND bus includes a plurality of signal lines and transmits and receives signals /CE0, /CE1, /CE2, /CE3, CLE, ALE, /WE, /RE, /WP, R/B0, R/B1, R/B2, R/B3, DQ<7:0>, and DQS, all of which are signals based on a NAND interface. The signals CLE, ALE, /WE, /RE, and /WP are received by the semiconductor memory devices 20, 30, 40, and 50. The signals R/B0, R/B1, R/B2, and R/B3 are received by the controller 10. In addition, each of the signals /CE0, /CE1, /CE2, and /CE3 is received by the semiconductor memory devices 20, 30, 40, and 50.

Each of the signals /CE0, /CE1, /CE2, and /CE3 is a signal for enabling the semiconductor memory devices 20, 30, 40, and 50. The signal CLE is a signal for notifying the semiconductor memory devices 20, 30, 40, and 50 that signals DQ<7:0> transmitted to the semiconductor memory devices 20, 30, 40, and 50 while the signal CLE is at a high (H) level are commands.

The signal ALE is a signal for notifying the semiconductor memory devices 20, 30, 40, and 50 that each of signals DQ<7:0> transmitted to the semiconductor memory devices 20, 30, 40, and 50 while the signal ALE is at high (H) level is an address. The signal /WE is a signal for instructing the semiconductor memory devices 20, 30, 40, and 50 to take in the signals DQ<7:0> transmitted thereto while the signal /WE is at a low (L) level.

The signal /RE is a signal for instructing the semiconductor memory devices 20, 30, 40, and 50 to output signals DQ<7:0>. The signal /WP is a signal for instructing the semiconductor memory devices 20, 30, 40, and 50 to prohibit data writing and erasing.

Each of the signals R/B0, R/B1, R/B2, and R/B3 is a signal for representing whether the semiconductor memory devices 20, 30, 40, and 50 are in a ready state (state in which the semiconductor memory devices 20, 30, 40, and 50 can receive a command from an outside) or in a busy state (state in which the semiconductor memory devices 20, 30, 40, and 50 cannot receive a command from an outside). The signal DQ<7:0> is, for example, an 8-bit signal. The signal DQ<7:0> contains data that is transmitted and received between the semiconductor memory devices 20, 30, 40, and 50 and the controller 10, and includes a command, an address, and data. The signal DQS is a signal used for controlling an operation timing of the semiconductor memory devices 20, 30, 40, and 50 related to the signal DQ<7:0>.

In the semiconductor memory devices 20, 30, 40, and 50, a common signal R/B may be used instead of using the independent signals R/B0, R/B1, R/B2, and R/B3. In this case, the controller 10 causes each of the semiconductor memory devices 20, 30, 40, and 50 to output status data by using a status read command. By outputting the status data, the controller 10 can detect whether the semiconductor memory devices 20, 30, 40, and 50 are in the busy state or the ready state. In addition, in the semiconductor memory devices 20, 30, 40, and 50, a common signal /CE may be used instead of using the independent signals /CE0, /CE1, /CE2, and /CE3. In this case, the controller 10 can designate any one of the semiconductor memory devices 20, 30, 40, and 50 as an operation target by supplying a chip address.

1.1.2 Regarding Configuration of Controller

Next, the controller 10 of the memory system 1 according to the first embodiment will be described with reference to FIG. 1. The controller 10 includes a processor (CPU: central processing unit) 11, an internal memory (RAM: random access memory) 12, a NAND interface circuit 13, a buffer memory 14, and a host interface circuit 15.

The processor 11 controls the overall operation of the controller 10. The processor 11 issues a write command based on the NAND interface to the semiconductor memory devices 20, 30, 40, and 50, for example, in response to a write command of data received from the host apparatus. Other operations such as a read operation, an erasing operation, or a calibration operation are also performed in response to a command received from the host apparatus.

The internal memory 12 is, for example, a semiconductor memory such as a dynamic RAM (DRAM) and is used as a work area of the processor 11. The internal memory 12 stores firmware for managing the semiconductor memory devices 20, 30, 40, and 50 and various management tables and the like.

The NAND interface circuit 13 is connected to the semiconductor memory devices 20, 30, 40, and 50 via the NAND bus, and controls communication with the semiconductor memory devices 20, 30, 40, and 50. The NAND interface circuit 13 is instructed to transmit a command, an address and write data to the semiconductor memory devices 20, 30, 40, and 50 by the processor 11. In addition, the NAND interface circuit 13 receives status data and read data from the semiconductor memory devices 20, 30, 40, and 50.

The buffer memory 14 temporarily stores data that is received by the controller 10 from the semiconductor memory devices 20, 30, 40, and 50 and host apparatus. The buffer memory 14 may temporarily store calibration result information obtained by, for example, a ZQ calibration operation of the semiconductor memory devices 20, 30, 40, and 50.

The host interface circuit 15 is connected to the host apparatus and controls communication with the host apparatus. The host interface circuit 15 transmits, for example, a command and data received from the host apparatus to the processor 11 and the buffer memory 14, respectively.

1.1.3 Regarding Configuration of Semiconductor Memory Device

Next, a configuration example of the semiconductor memory device according to the first embodiment will be described with reference to FIG. 2. The semiconductor memory devices 20, 30, 40, and 50 have, for example, the same configuration. Therefore, in the following description, a configuration of the semiconductor memory device 20 among the semiconductor memory devices 20, 30, 40, and 50 will be described, and the description of configurations of the semiconductor memory devices 30, 40, and 50 will not be made.

Figure 2:
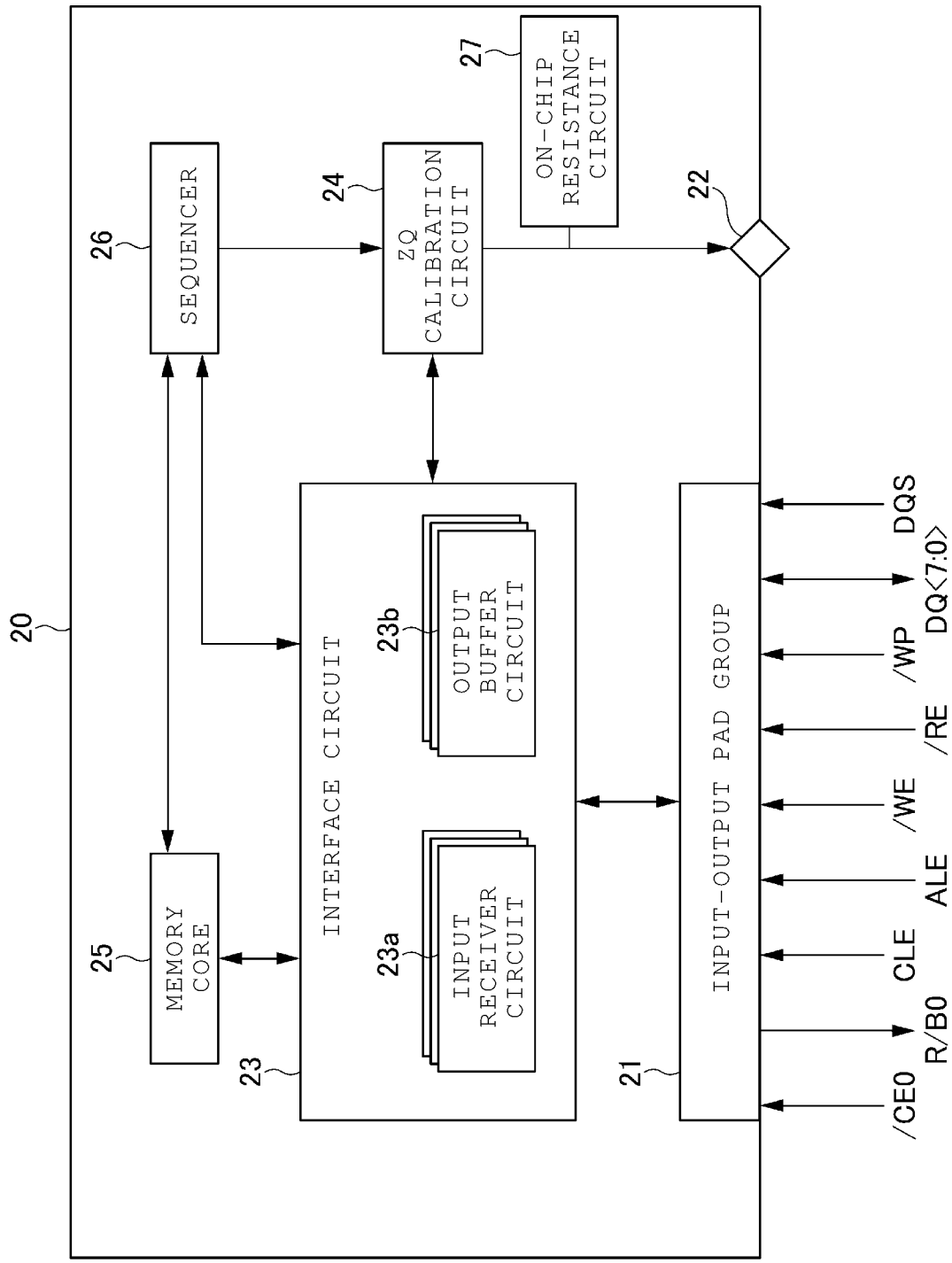
FIG. 2 is a block diagram illustrating a configuration of a semiconductor memory device according to the first embodiment.

As illustrated in FIG. 2, the semiconductor memory device 20 includes an input-output pad group 21, a ZQ pad 22, an interface circuit 23, a ZQ calibration circuit 24, a memory core 25, a sequencer 26, and an on-chip resistance circuit 27.

The input-output pad group 21 transmits the signals /CE0, CLE, ALE, /WE, /RE, /WP, DQ<7:0>, and DQS received from the controller 10 to the interface circuit 23. In addition, input-output pad group 21 transmits the signals DQ<7:0> and R/B received from the interface circuit 23 to the outside. The input-output pad group 21 includes a plurality of pads (not illustrated), and the same type of signals are input to and output from a given pad via a given signal line. One pad in the input-output pad group 21 can be recognized as one output terminal having a given output impedance from outside the semiconductor memory device 20.

One end of the ZQ pad 22 is connected to the ZQ calibration circuit 24. The ZQ pad 22 can be recognized as one output terminal having a given output impedance from outside the semiconductor memory device 20.

The interface circuit 23 transmits a command and an address in the signal DQ<7:0> to the sequencer 26, and transmits and receives data to and from the memory core 25. The interface circuit 23 includes a plurality of input receiver circuits 23a and a plurality of output buffer circuits 23b. For example, the same type of signals are assigned to one input receiver circuits 23a and one output buffer circuits 23b. That is, one input receiver circuit 23a receives any one of the signals /CE0, CLE, ALE, /WE, /RE, /WP, and DQS from the controller 10 via one pad. One output buffer circuit 23b transmits the signal R/B0 to the controller 10 via one pad and notifies the state of the semiconductor memory device 20 to the outside. In addition, one input receiver circuit 23a and one output buffer circuit 23b transmit and receive the signal DQ<7:0> to and from the controller 10 via one pad. In the following description, among the plurality of input receiver circuits 23a and the plurality of output buffer circuits 23b, the input receiver circuits and the output buffer circuits corresponding to the signal DQ<k> (where k represents an integer of 0≤k<8) are referred to as input receiver circuits 23a<k> and output buffer circuits 23b<k>.

The ZQ calibration circuit 24 has a function of executing a ZQ calibration operation of calibrating an output impedance of the semiconductor memory device 20 based on the on-chip resistance circuit 27. The details of the ZQ calibration circuit 24 will be described below.

The memory core 25 includes a memory cell array that stores data. The memory core 25 is configured such that an operation of reading data from the memory cell array and an operation of writing data into the memory cell array can be executed.

The sequencer 26 is a controller that receives a command and controls the entire semiconductor memory device 20 according to a sequence based on the received command. Specifically, for example, the sequencer 26 controls the interface circuit 23 and the ZQ calibration circuit 24 based on the command and executes the ZQ calibration operation. The ZQ calibration circuit 24 executes ZQ calibration to generate a ZQ calibration value. The sequencer 26 controls the ZQ calibration circuit 24 to apply the ZQ calibration value to the interface circuit 23.

The on-chip resistance circuit 27 functions as a reference resistor for calibrating the output impedance of the semiconductor memory device 20. The details of the on-chip resistance circuit 27 will be described below. In the embodiment, the reference resistor is provided in the semiconductor memory device 20. Alternatively, the reference resistor may be provided as an external resistor connected to the ZQ pad 22. In such a case, the reference resistor is a resistor shared by the semiconductor memory devices 20, 30, 40, and 50.

Figure 3:
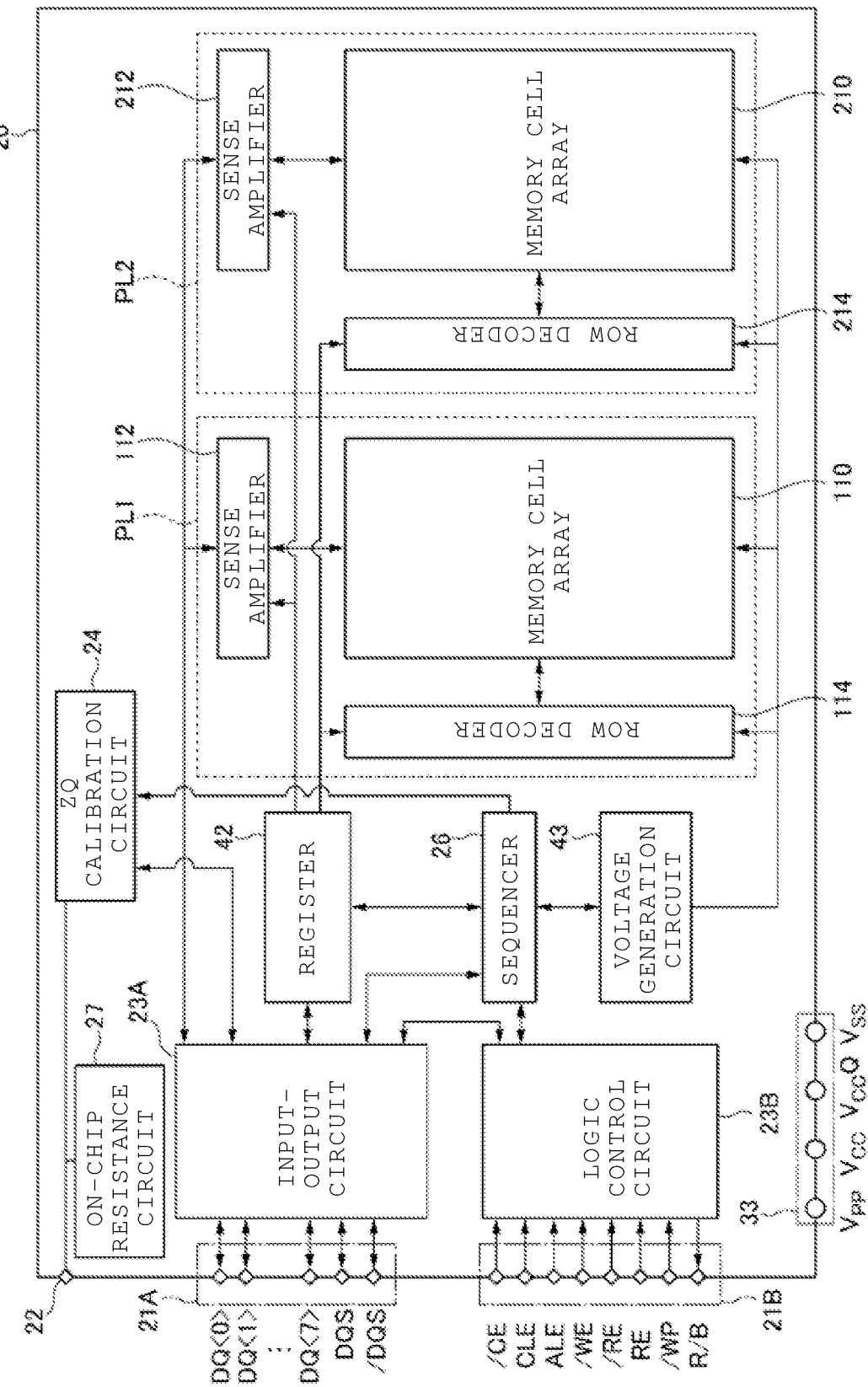
FIG. 3 is another block diagram illustrating a configuration of the semiconductor memory device according to the first embodiment.

Next, a block configuration of the semiconductor memory device 20 according to the first embodiment will be described with reference to FIG. 3. As illustrated in FIG. 3, the semiconductor memory device 20 includes two planes PL1 and PL2, an input-output circuit 23A, a logic control circuit 23B, the sequencer 26, a register 42, a voltage generation circuit 43, an input-output pad group 21A, a logic control pad group 21B, a power input terminal group 33, the ZQ pad 22, the ZQ calibration circuit 24, and the on-chip resistance circuit 27.

The plane PL1 includes a memory cell array 110, a sense amplifier 112, and a row decoder 114. In addition, the plane PL2 includes a memory cell array 210, a sense amplifier 212, and a row decoder 214. A configuration of the plane PL1 is the same as a configuration of the plane PL2. A configuration of the memory cell array 110 is the same as a configuration of the memory cell array 210. A configuration of the sense amplifier 112 is the same as a configuration of the sense amplifier 212. A configuration of the row decoder 114 is the same as a configuration of the row decoder 214. The number of planes provided in the semiconductor memory device 20 may be two as in the embodiment, may be one, or may be three or more.

The memory cell array 110 and the memory cell array 210 store data. Each of the memory cell array 110 and the memory cell array 210 includes a plurality of memory cell transistors associated with word lines and bit lines.

The input-output circuit 23A transmits and receives the signal DQ<7:0> and data strobe signals DQS and /DQS to and from the controller 10. The input-output circuit 23A transmits a command and an address in the signal DQ<7:0> to the register 42. In addition, the input-output circuit 23A transmits and receives write data and read data to and from the sense amplifier 112 or the sense amplifier 212. The input-output circuit 23A has the function of an "input circuit" that receives a command or the like from the controller 10, and the function of an "output circuit" that outputs data to the controller 10. Instead of such a configuration, the input circuit and the output circuit may be configured as separate circuits.

The logic control circuit 23B receives the chip enable signal /CE, the command latch enable signal CLE, the address latch enable signal ALE, the write enable signal /WE, the read enable signals RE and /RE, and the write-protect signal /WP from the controller 10. In addition, the logic control circuit 23B transmits the ready/busy signal R/B to the controller 10 and notifies the state of the semiconductor memory device 20 to the outside.

Both the input-output circuit 23A and the logic control circuit 23B are circuits that input and output signals to and from the controller 10. That is, the input-output circuit 23A and the logic control circuit 23B are provided as interface circuits of the semiconductor memory device 20.

The sequencer 26 controls the operation of each of the units such as the planes PL1 and PL2 or the voltage generation circuit 43 based on a control signal transmitted from the controller 10 to the semiconductor memory device 20. The sequencer 26 is a control circuit that controls the operations of the memory cell arrays 110 and 210 and the like. Both the sequencer 26 and the logic control circuit 23B can also be considered as a control circuit.

The register 42 temporarily stores a command or an address. The register 42 is a portion that stores status information representing the state of each of the planes PL1 and PL2. The status information is output from the input-output circuit 23A to the controller 10 as a state signal in response to a request from the controller 10.

The voltage generation circuit 43 generates a voltage required for each of the write operation, the read operation, and the erasing operation of data in the memory cell arrays 110 and 210 based on an instruction from the sequencer 26. Examples of the voltage include a voltage such as VPGM, VPASS_PGM, or VPASS_READ that is applied to a word line or a voltage that is applied to a bit line. The voltage generation circuit 43 can apply a voltage individually to each of word lines or bit lines such that the plane PL1 and the plane PL2 can operate in parallel.

The input-output pad group 21A includes a plurality of terminals (pads) through which signals are communicated between the controller 10 and the input-output circuit 23A. The terminals correspond respectively to the signal DQ<7: 0> and the data strobe signals DQS and /DQS.

The logic control pad group 21B includes a plurality of terminals (pads) through which signals are communicated between the controller 10 and the logic control circuit 23B. The terminals correspond respectively to the chip enable signal /CE, the command latch enable signal CLE, the address latch enable signal ALE, the write enable signal /WE, the read enable signals RE and /RE, the write-protect signal /WP, and the ready/busy signal R/B.

The power input terminal group 33 includes a plurality of terminals through which each of the voltages required for the operation of the semiconductor memory device 20 is applied. The voltages to be applied to the respective terminals include power supply voltages Vcc, VccQ, and Vpp and a ground voltage Vss.

The power supply voltage Vcc is a circuit power supply voltage that is supplied from the outside as an operating power, for example, a voltage of about 3.3 V. The power supply voltage VccQ is, for example, a voltage of 1.2 V. The power supply voltage VccQ is a voltage that is used when the signals are transmitted and received between the controller 10 and the semiconductor memory device 20. The power supply voltage Vpp is higher than the power supply voltage Vcc, for example, a voltage of 12 V.

When data is written into or erased from the memory cell array 110 or 210, a high voltage (VPGM) of about 20 V is required. When the power supply voltage Vpp of about 12 V is boosted by a booster circuit of the voltage generation circuit 43, a desired voltage can be generated with higher speed and lower power consumption as compared to a case where the power supply voltage Vcc of about 3.3 V is boosted to the desired voltage. On the other hand, when the semiconductor memory device 20 is used, for example, in an environment where a high voltage cannot be supplied, the power supply voltage Vpp is not supplied. Even when the power supply voltage Vpp is not supplied, the semiconductor memory device 20 can execute various operations as long as the power supply voltage Vcc is supplied. The power supply voltage Vcc is a power supply that is supplied as a standard to the semiconductor memory device 20, and the power supply voltage Vpp is a power supply that is additionally or optionally supplied, for example, depending on a usage environment.

One end of the ZQ pad 22 is connected to the ZQ calibration circuit 24. The ZQ pad 22 may be recognized as one output terminal having a given output impedance from the outside of the semiconductor memory device 20.

The ZQ calibration circuit 24 has a function of executing a ZQ calibration operation of calibrating an output impedance of the semiconductor memory device 20 based on the on-chip resistance circuit 27. The details of the ZQ calibration circuit 24 will be described below.

The on-chip resistance circuit 27 functions as a reference resistor for calibrating the output impedance of the semiconductor memory device 20. The details of the on-chip resistance circuit 27 will be described below. In the embodiment, the reference resistor is provided in the semiconductor memory device 20. Alternatively, the reference resistor may be provided as an external resistor connected to the ZQ pad 22.

1.1.4 Configuration of ZQ Calibration Circuit

Next, a configuration of the ZQ calibration circuit in the semiconductor memory device according to the first embodiment will be described.

1.1.4.1 Overall Configuration of ZQ Calibration Circuit

Figure 4:
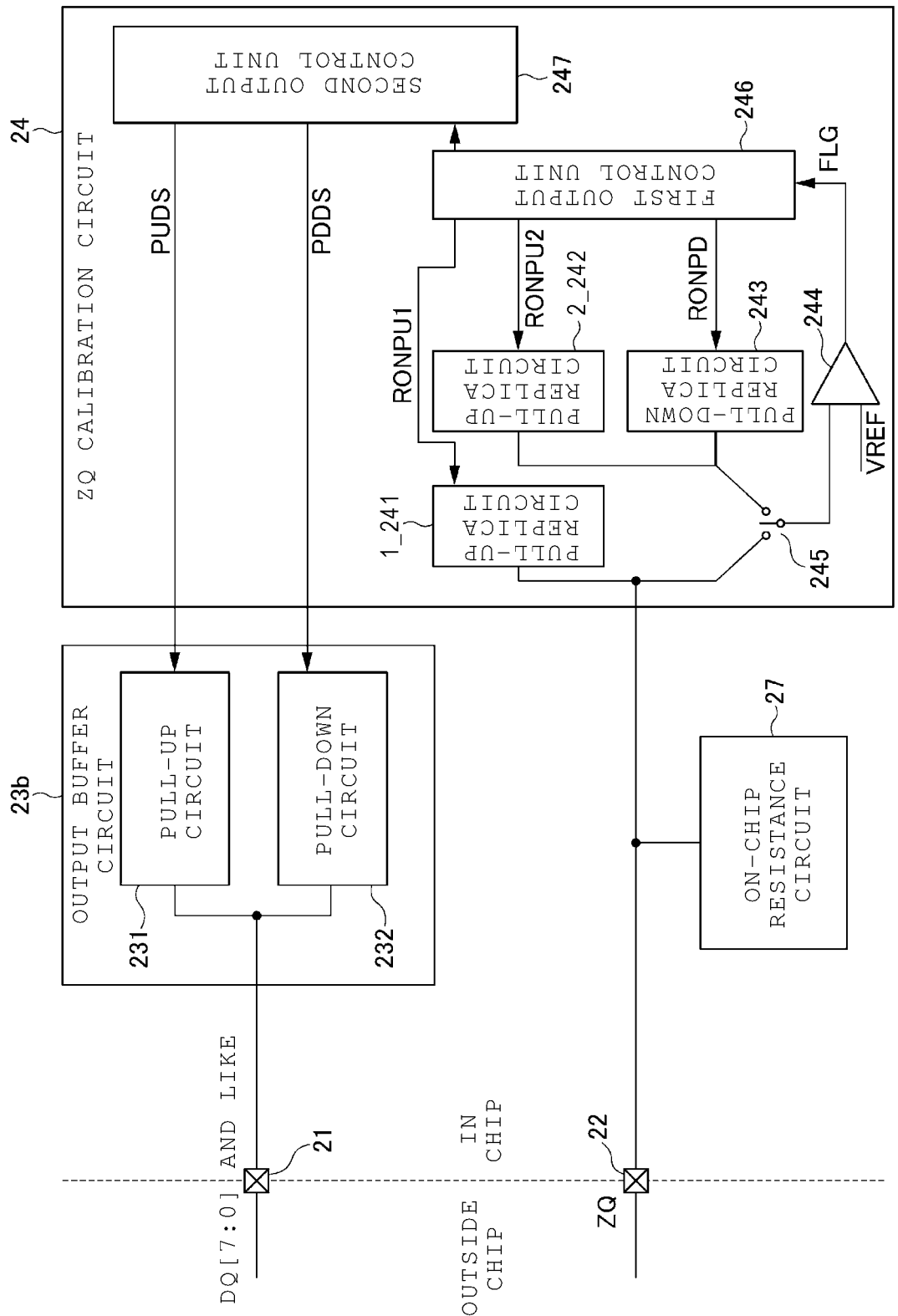
FIG. 4 is a block diagram illustrating a configuration of a ZQ calibration circuit according to the first embodiment.

An overall configuration of the ZQ calibration circuit according to the first embodiment will be described with reference to FIG. 4. As illustrated in FIG. 4, the ZQ calibration circuit 24 includes a pull-up replica circuit 1_241, a pull-up replica circuit 2_242, a pull-down replica circuit 243, a comparator 244, a switch 245, a first output control unit 246, and a second output control unit 247.

When the pull-up replica circuit 1_241 receives an impedance control signal RONPU1 from the first output control unit 246, the impedance at an output end changes depending on the received impedance control signal RONPU1. The output end of the pull-up replica circuit 1_241 is connected to the ZQ pad 22 and the on-chip resistance circuit 27. The pull-up replica circuit 1_241 transmits a voltage VP to a first input end of the comparator 244 through the switch 245 depending on the size of the impedance at the output end. The voltage VP is determined depending on the ratio of the sizes of the output impedance of the pull-up replica circuit 1_241 and the impedance of the on-chip resistance circuit 27.

The pull-up replica circuit 2_242 has substantially the same configuration as the pull-up replica circuit 1_241. When the pull-up replica circuit 2_242 receives an impedance control signal RONPU2 from the first output control unit 246, the impedance at an output end changes depending on the received impedance control signal RONPU2. The pull-up replica circuit 2_242 is adjusted to have substantially the same output impedance as the pull-up replica circuit 1_241 by using the impedance control signal RONPU2.

When the pull-down replica circuit 243 receives an impedance control signal RONPD from the first output control unit 246, the impedance at an output end changes depending on the received impedance control signal RONPD. The output end of the pull-down replica circuit 243 is connected to the pull-up replica circuit 2_242. The pull-down replica circuit 243 transmits a voltage VP to a first input end of the comparator 244 through the switch 245 depending on the size of the impedance at the output end. The voltage VP is determined depending on the ratio of the sizes of the output impedance of the pull-down replica circuit 243 and the impedance of the pull-up replica circuit 2_242.

The comparator 244 compares voltages at the first input end and a second input end to each other, and transmits an output signal corresponding to the comparison result to the first output control unit 246.

In the comparator 244, the voltage VP of the switch 245 is supplied to the first input end, and a voltage VREF is supplied to the second input end. For example, when the voltage VP is higher than the voltage VREF, the comparator 244 transmits an output signal FLG of high (H) level, and when the voltage VP is lower than the voltage VREF, the comparator 244 transmits an output signal FLG of low (L) level.

The voltage VREF is set to be, for example, an intermediate value between the voltage VccQ and the voltage Vss. That is, in this case, a relationship between the voltage VREF, the voltage VccQ, and the voltage Vss is represented by "VREF=(VccQ−Vss)/2)". The voltage VccQ is a power supply voltage that is supplied from the semiconductor memory device 20 during the ZQ calibration operation, and is higher than the voltage Vss. The voltage Vss is a ground voltage and is, for example, 0 V.

1.1.4.2 Configuration of Replica Circuit

Next, a configuration of a replica circuit in the ZQ calibration circuit of the semiconductor memory device according to the first embodiment will be described by using the pull-up replica circuit 1_241 as an example.

The pull-up replica circuit 1_241 includes, for example, five transistors and a resistor. The number of transistors in the pull-up replica circuit 1_241 corresponds to the number of bits of the impedance control signal RONPU1 and is not limited to five. Any number of transistors corresponding to the number of bits of the impedance control signal RONPU1 may be applied.

The transistors are p-channel metal oxide semiconductor (MOS) transistors, and are connected in parallel between the power supply of the voltage VccQ and one end of the resistor. That is, in each of the transistors, the voltage VccQ is supplied to one end of the transistor, and one end of the resistor is connected to the other end of the transistor. In addition, in each of the transistors, the impedance control signal RONPU1 is input to a gate. The other end of the resistor is connected to the ZQ pad 22.

Among the transistors, transistors to be set to an ON state are selected by using the impedance control signal RONPU1. The low (L) level of the impedance control signal RONPU1 enables the transistors to enter an ON state, and the high (H) level of the impedance control signal RONPU1 enables the transistors to enter an OFF state. In addition, the transistors have, for example, different sizes (on-resistances). Therefore, among the transistors, transistors having different on-resistances can be selected by using the impedance control signal RONPU1 that changes depending on the output signal FLG of the comparator.

With the above-described configuration, the pull-up replica circuit 1_241 can set, as the output impedance, the combined resistance of the transistors selected to have the on-resistances by using the impedance control signal RONPU1 and the resistor.

1.1.5 Configuration of On-Chip Resistance Circuit

Next, a configuration of the on-chip resistance circuit in the semiconductor memory device according to the first embodiment will be described with reference to FIG. 5.

Figure 5:
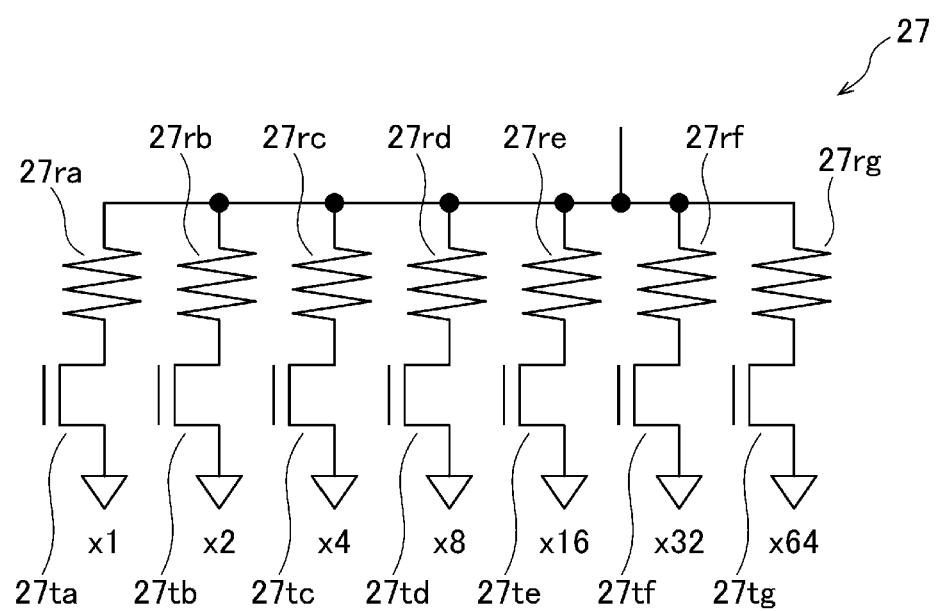
FIG. 5 is a block diagram illustrating a configuration of an on-chip resistance circuit according to the first embodiment.

As illustrated in FIG. 5, the on-chip resistance circuit 27 includes, for example, seven resistors 27ra, 27rb, 27rc, 27rd, 27re, 27rf, and 27rg and seven transistors 27ta, 27tb, 27tc, 27td, 27te, 27tf, and 27tg.

The resistors 27ra, 27rb, 27rc, 27rd, 27re, 27rf, and 27rg are connected in parallel. The resistors 27ra, 27rb, 27rc, 27rd, 27re, 27rf, and 27rg are provided such that the resistance values are multiples of each other. For example, as designed values, the resistor 27ra is set to 30,400Ω, the resistor 27rb is set to 15,200Ω, the resistor 27rc is set to 7,600Ω, the resistor 27rd is set to 3,800Ω, the resistor 27re is set to 1,900Ω, the resistor 27rf is set to 950Ω, and the resistor 27rg is set to 475Ω.

The transistor 27ta is connected in series to the resistor 27ra. The transistor 27tb is connected in series to the resistor 27rb. The transistor 27tc is connected in series to the resistor 27rc. The transistor 27td is connected in series to the resistor 27rd. The transistor 27te is connected in series to the resistor 27re. The transistor 27tf is connected in series to the resistor 27rf. The transistor 27tg is connected in series to the resistor 27rg.

The transistors 27ta, 27tb, 27tc, 27td, 27te, 27tf, and 27tg are n-channel MOS transistors, and when the transistors 27ta, 27tb, 27tc, 27td, 27te, 27tf, and 27tg enter an ON state, the resistors 27ra, 27rb, 27rc, 27rd, 27re, 27rf, and 27rg that are connected in series are selected.

The entirety of the on-chip resistance circuit 27 is set to, for example, 300 Ω as a reference resistance value. The resistors 27ra, 27rb, 27rc, 27rd, 27re, 27rf, and 27rg are set to the above-described resistance values as the designed values, but a manufacturing error may occur in the resistance value. Therefore, an appropriate resistance according to the manufacturing error is selected.

As illustrated in FIG. 6, in Case 1 where the resistors 27ra, 27rb, 27rc, 27rd, 27re, 27rf, and 27rg are manufactured without error, the resistors 27ra, 27rc, 27rf, and 27rg are selected, and the transistors 27ta, 27tc, 27tf, and 27tg corresponding thereto enter an ON state. In this case, the combined resistance is 301.0Ω, which is the resistance value of the on-chip resistance circuit 27.

In Case 2 where the resistors 27ra, 27rb, 27rc, 27rd, 27re, 27rf, and 27rg are manufactured with an error of the designed value+25%, the resistors 27ra, 27rb, 27rc, 27rd, 27re, 27rf, and 27rg are selected, and the transistors 27ta, 27tb, 27tc, 27td, 27te, 27tf, and 27tg corresponding thereto enter an ON state. In this case, the combined resistance is 299.2Ω, which is the resistance value of the on-chip resistance circuit 27.

In Case 3 where the resistors 27ra, 27rb, 27rc, 27rd, 27re, 27rf, and 27rg are manufactured with an error of the designed value−25%, the resistors 27rc, 27rd, and 27rg are selected, and the transistors 27tc, 27td, and 27tg corresponding thereto enter an ON state. In this case, the combined resistance is 300.0Ω, which is the resistance value of the on-chip resistance circuit 27.

1.1.6 Configuration of Interface Circuit

Next, the interface circuit in the semiconductor memory device according to the first embodiment will be described.

1.1.6.1 Regarding Connection to Input-Output Pads

The input-output pad group 21 includes a plurality of pads 21<7:0> that transmit a plurality of signals DQ<7:0>, respectively. The input receiver circuits 23a<k> connected to each of the pads 21<7:0> have substantially the same configuration and the output buffer circuits 23b<k> connected to each of the pads 21<7:0> have substantially the same configuration.

1.1.6.2 Configuration of Output Buffer Circuit

The output buffer circuits 23b<k> includes a pull-up circuit 231 and a pull-down circuit 232.

The pull-up circuit 231 has the same configuration as the pull-up replica circuit 1_241 and the pull-up replica circuit 2_242. That is the pull-up circuit 231 includes, for example, five transistors and a resistor.

The transistors are p-channel metal oxide semiconductor (MOS) transistors, and are connected in parallel between the power supply of the voltage VccQ and one end of the resistor. That is, in each of the transistors, the voltage VccQ is supplied to one end of the transistor, and one end of the resistor is connected to the other end of the transistor. In addition, in each of the transistors, an impedance control signal PUDS is input to a gate. The other end of the resistor is connected to the pad 21.

Among the transistors, transistors to be set to an ON state are selected by using the impedance control signal PUDS. The low (L) level of the impedance control signal PUDS enables the transistors to enter an ON state, and the high (H) level of the impedance control signal PUDS enables the transistors to enter an OFF state. In addition, the transistors have, for example, different sizes (on-resistances). Therefore, among the transistors, transistors having different on-resistances can be selected by using the impedance control signal PUDS.

With the above-described configuration, the pull-up circuit 231 can set, as the output impedance, the combined resistance of the transistors selected to have the on-resistances by using the impedance control signal PUDS and the resistor.

The pull-down circuit 232 has the same configuration as the pull-down replica circuit 243. The pull-down circuit 232 can set, as the output impedance, the combined resistance of the transistors selected to have the on-resistances by using an impedance control signal PDDS and the resistor.

1.1.6.3 Configuration of Input Receiver Circuit

Next, the input receiver circuit in the semiconductor memory device according to the first embodiment will be described. The input receiver circuits 23a<k> have a function of determining the level of a data signal input from, for example, the pad 21<k> and transmitting the determination result to the memory core 25 or the ZQ calibration circuit 24. The input receiver circuits 23a<k> includes, for example, a comparator and a transistor.

1.2 Operation

1.2.1 Regarding ZQ Calibration Operation

Next, the calibration operation of the ZQ calibration circuit 24 will be described with reference to FIG. 4.

(1) The switch 245 is switched to the pull-up replica circuit 1_241 side. In the comparator 244, a voltage at a point between the on-chip resistance circuit 27 of 300 Ω and the pull-up replica circuit 1_241 is compared to the voltage VREF.

(2) The comparison result of (1) is output to the first output control unit 246. The first output control unit 246 adjusts the impedance control signal RONPU1 to discover the impedance control signal RONPU1 at which the pull-up replica circuit 1_241 reaches 300Ω.

(3) The impedance control signal RONPU1 determined as the result of (2) is copied as the impedance control signal RONPU2 and the first output control unit 246 outputs the impedance control signal RONPU2 to the pull-up replica circuit 2_242. As a result, the pull-up replica circuit 2_242 reaches 300Ω.

(4) The switch 245 is switched to the pull-up replica circuit 2_242 and the pull-down replica circuit 243 side. In the comparator 244, a voltage at a point between the pull-up replica circuit 2_242 of 300 Ω and the pull-down replica circuit 243 is compared to the voltage VREF.

(5) The comparison result of (4) is output to the first output control unit 246. The first output control unit 246 adjusts the impedance control signal RONPD to discover the impedance control signal RONPD at which the pull-down replica circuit 243 reaches 300Ω.

(6) The first output control unit 246 outputs the impedance control signal RONPU1 determined as the result of (2) and the impedance control signal RONPD determined as the result of (5) to the second output control unit 247 as the ZQ calibration value.

(7) The second output control unit 247 executes an arithmetic operation according to a set driver strength, the impedance control signal RONPU1, and the impedance control signal RONPD, and determines a driver strength signal PUDS and a driver strength signal PDDS. The driver strength signal PUDS is output to the pull-up circuit 231. The driver strength signal PDDS is output to the pull-down circuit 232.

1.2.2. Regarding Timing of ZQ Calibration Operation

Next, an execution timing of the ZQ calibration operation will be described. The ZQ calibration operation includes: ZQ calibration long that is executed mainly during initialization; and ZQ calibration short that is executed mainly during runtime. In general, the characteristic of the semiconductor circuit are affected by a variation in manufacturing process, a variation in temperature and a variation in supplied voltage. The ZQ calibration long is executed to calibrate mismatches in parameters due to the variation in the manufacturing process. Execution time tZQCL of the ZQ calibration long is, for example, about 1 μs. For example, an execution command of the ZQ calibration long is F9h.

The ZQ calibration short is executed to calibrate mismatches in parameters due to the variation in temperature and/or the variation in supplied voltage. More specifically, the ZQ calibration short is executed to correct a variation in driver strength. The ZQ calibration short needs to be executed regularly. Execution time tZQCS of the ZQ calibration short is, for example, about 300 ns. For example, an execution command of the ZQ calibration short is D9h.

Figure 7:
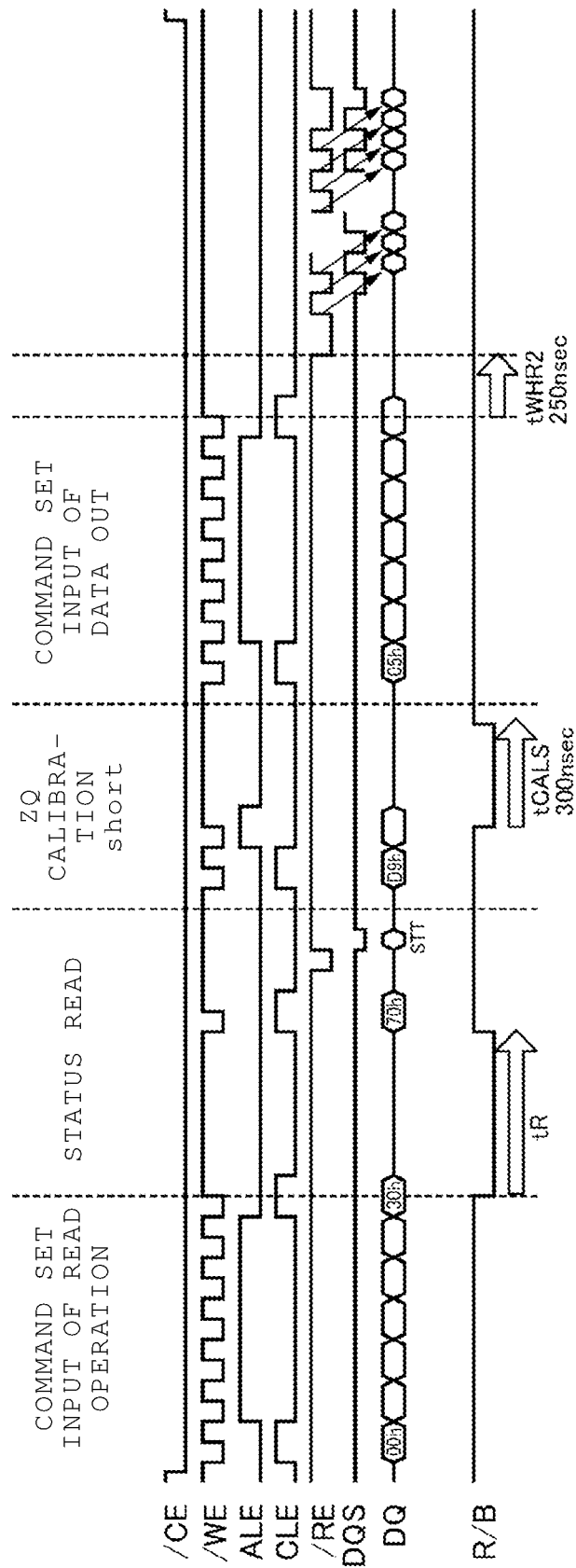
FIG. 7 is a timing chart illustrating a ZQ calibration operation of a semiconductor memory device according to a comparative example.

Before describing the execution timing of the calibration operation according to the embodiment, an execution timing of a calibration operation according to a comparative example will be described. As illustrated in FIG. 7, in the comparative example, before inputting a command set of data out and after inputting a command set of the read operation and executing status read, the execution command D9h of the ZQ calibration short is issued, and the ZQ calibration operation is executed. In the comparative example, the ZQ calibration short is executed between the status read and the data out. Therefore, as a period of time from the input of the command set of the read operation to the output of data in the semiconductor memory device, an input period of a ZQ calibration short instruction command and an execution time of the ZQ calibration short are added.

In the embodiment, the period of time required to input the command dedicated to the ZQ calibration short and the execution time of the ZQ calibration short are not necessary. Therefore, a configuration illustrated in FIG. 8 is adopted.

Figure 8:
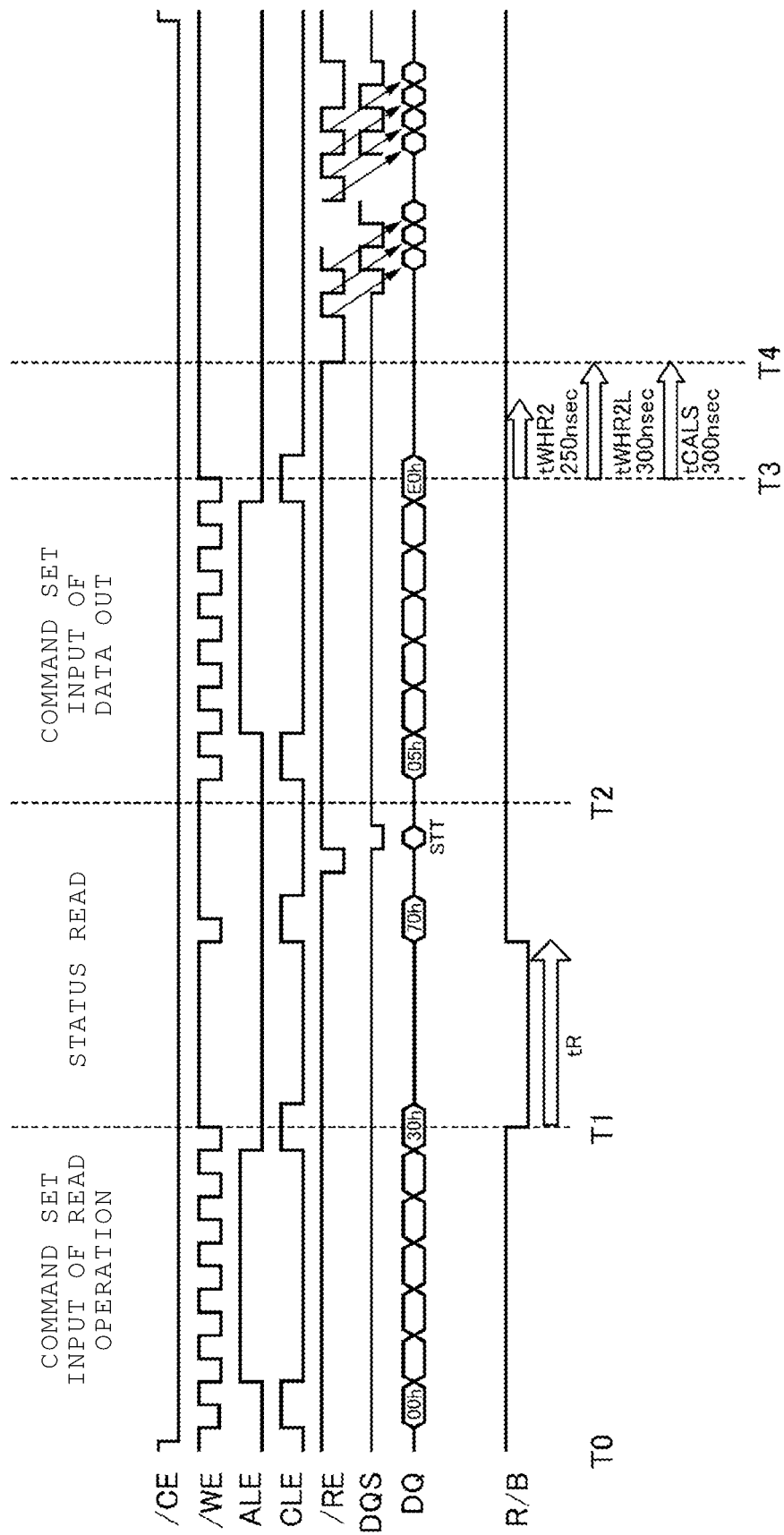
FIG. 8 is a timing chart illustrating a ZQ calibration operation of the semiconductor memory device according to the first embodiment.

As illustrated in FIG. 8, first, a command set of the read operation is input. Specifically, at time T0, the controller 10 sets the signal /CE0 to L level, and enables the semiconductor memory device 20. Next, the controller 10 sets the signal /WE to L level, sets the signal CLE to H level, and transmits a command 00h. Next, the controller 10 sets the signal /WE to L level, sets the signal ALE to H level, and transmits an address. After completing the transmission of the address to be read, the controller 10 sets the signal /WE to L level, sets the signal CLE to H level, and transmits a command 30h.

At time t1, the controller 10 transmits the command 30h and starts the read operation. An internal operation such as application of a read voltage is executed such that the semiconductor memory device 20 enters the busy state. Therefore, the sequencer 26 sets the signal R/B0 to L level to notify the controller 10 that the semiconductor memory device 20 is in the busy state. Instead of or in addition to notifying the controller 10 of the ready state by setting the dedicated ready/busy indication signal R/B, the sequencer 26 may store information representing that the semiconductor memory device 20 is in the busy state, in a status register in the register 42 for allowing the controller 10 to acquire a ready/busy status by the status read operation. After a required period of time tR for the read operation elapses, the sequencer 26 sets the signal R/B0 to H level to notify the controller 10 that the semiconductor memory device 20 is in the ready state. Instead of or in addition to notifying the controller 10 of the ready state by setting the dedicated ready/busy indication signal R/B, the sequencer 26 may store information representing that the semiconductor memory device 20 is in the ready state, in the status register in the register 42 for allowing the controller 10 to acquire a ready/busy status by the status read operation. To cause the semiconductor memory device 20 to output the status data including information indicating the ready/busy state, the controller 10 sets the signal /WE to L level, sets the signal CLE to H level, and transmits a command 70h. As a result, the semiconductor memory device 20 executes status read, and outputs status data to the controller 10.

When the controller 10 verifies that the semiconductor memory device 20 is in the ready state, the controller 10 inputs a command set for data out. Specifically, at time T2, the controller 10 sets the signal /WE to L level, sets the signal CLE to H level, and transmits a command 05h. Next, the controller 10 sets the signal /WE to L level, sets the signal ALE to H level, and transmits an address. After completing the transmission of the column address to be read, the controller 10 sets the signal /WE to L level, sets the signal CLE to H level, and transmits a command E0h. As a result, a preparation for executing the data out starts.

After a required period of time tWHR2 from the input of the command E0h elapses during which time an output of initial 8-bit data is prepared, the controller 10 switches (toggles) the signal /RE and the signal RE between L level and H level, switches the signal DQS and the signal /DQS between H level and L level, and executes the data out.

In the embodiment, the ZQ calibration short is executed after receiving the command E0h. Here, the required period of time tWHR2 for preparing the output of initial 8-bit data after receiving the command E0h is, for example, 250 ns. On the other hand, an execution time tCALS of the ZQ calibration short is, for example, 300 ns. Accordingly, even if the ZQ calibration short is simply executed after receiving the command E0h, an operation period of the ZQ calibration short and an execution period of the data out overlap each other. Therefore, in the embodiment, for example, tWHR2 is replaced with tWHR2L extended to 300 ns that is longer than or equal to the operation period of the ZQ calibration short.

As a result, the required period of time tWHR2 for preparing the output of initial 8-bit data after receiving the command E0h is made to overlap with the operation period of the ZQ calibration short. As a result, the input period of the ZQ calibration short instruction command can be omitted. In addition, the ZQ calibration short can be executed immediately before the data out execution period. Therefore, the data out can be executed with higher accuracy.

In the above example, the ZQ calibration operation is executed during the read operation. In addition, the ZQ calibration operation also may be executed during the write operation. The description will be made with reference to FIG. 9.

Figure 9:
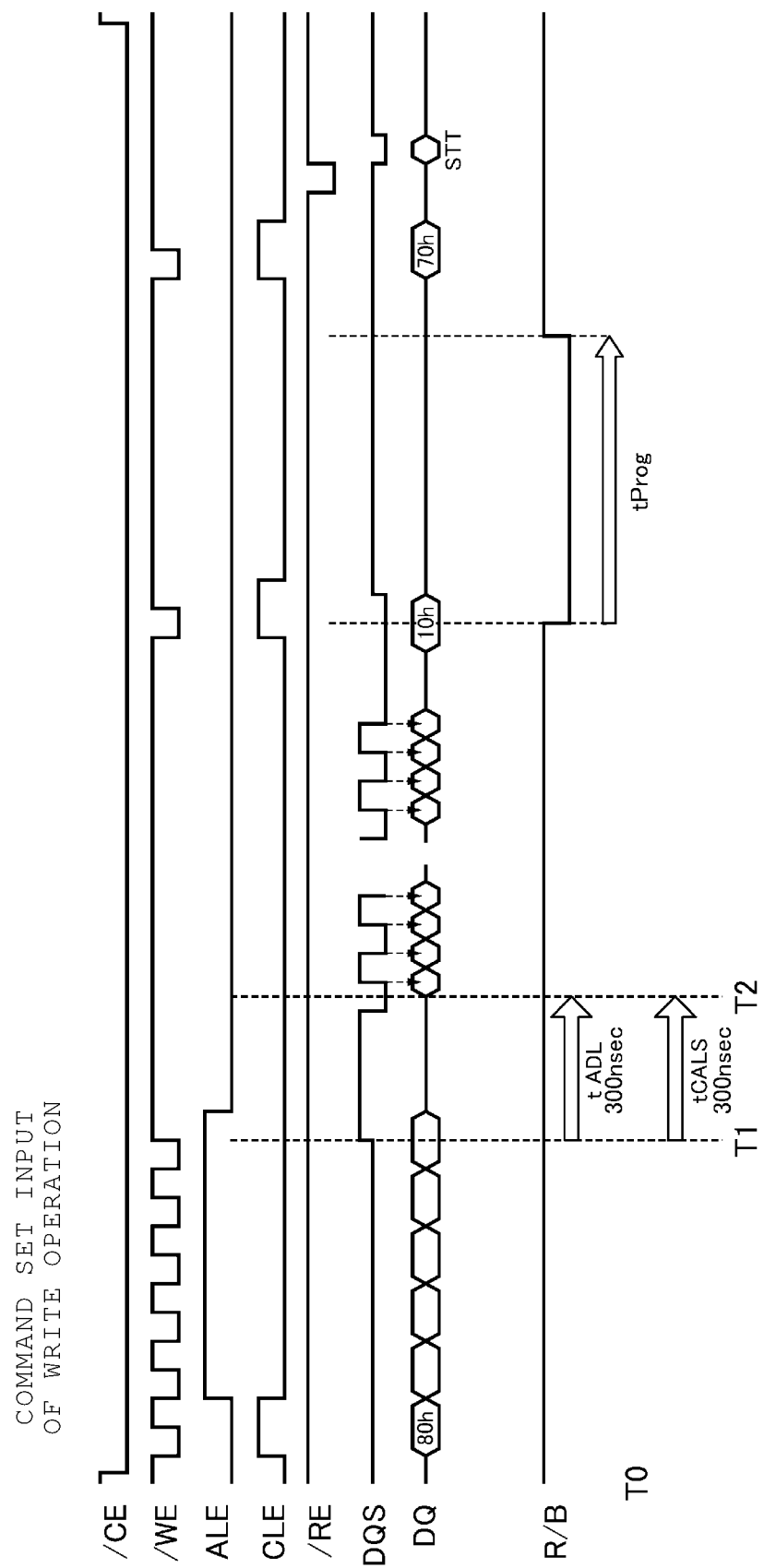
FIG. 9 is a timing chart illustrating the ZQ calibration operation of the semiconductor memory device according to the first embodiment.

As illustrated in FIG. 9, first, a command set of the write operation is input. Specifically, at time T0, the controller 10 sets the signal /WE to L level, sets the signal CLE to H level, and transmits a command 80h. Next, the controller 10 sets the signal /WE to L level, sets the signal ALE to H level, and transmits an address. After a required period of time tADL from time t1 (at which the transmission of the address is completed) elapses, during which time input of initial 8-bit data is prepared, the controller 10 switches the signal DQS between L and H and transmits the data. Next, the controller 10 transmits a command 10h, and a required period of time tProg for executing an internal operation such as application or verification of a program voltage, elapses.

In the embodiment, the ZQ calibration operation is executed using the required period of time tADL. The sequencer 26 executes the ZQ calibration short on the condition that the command 80h is input and a predetermined number of addresses are input. The required period of time tADL from the completion of the transmission of the address for preparing the input of initial 8-bit data is, for example, 300 ns. Accordingly, when the execution time tCALS of the ZQ calibration short is 300 ns, the ZQ calibration short can be executed during the required period of time tADL.

Next, a modification example of the embodiment will be described. In the embodiment described above with reference to FIG. 8, when the data out command set (command 05h-address-command E0h) is input, the sequencer 26 executes the ZQ calibration operation. On the other hand, in the modification example, when only the data out command set (command 05h-address-command E0h) is input, the sequencer 26 does not execute the ZQ calibration operation. When a prefix command XXh is added to the data out command set, the sequencer 26 executes the ZQ calibration operation.

Figure 10:
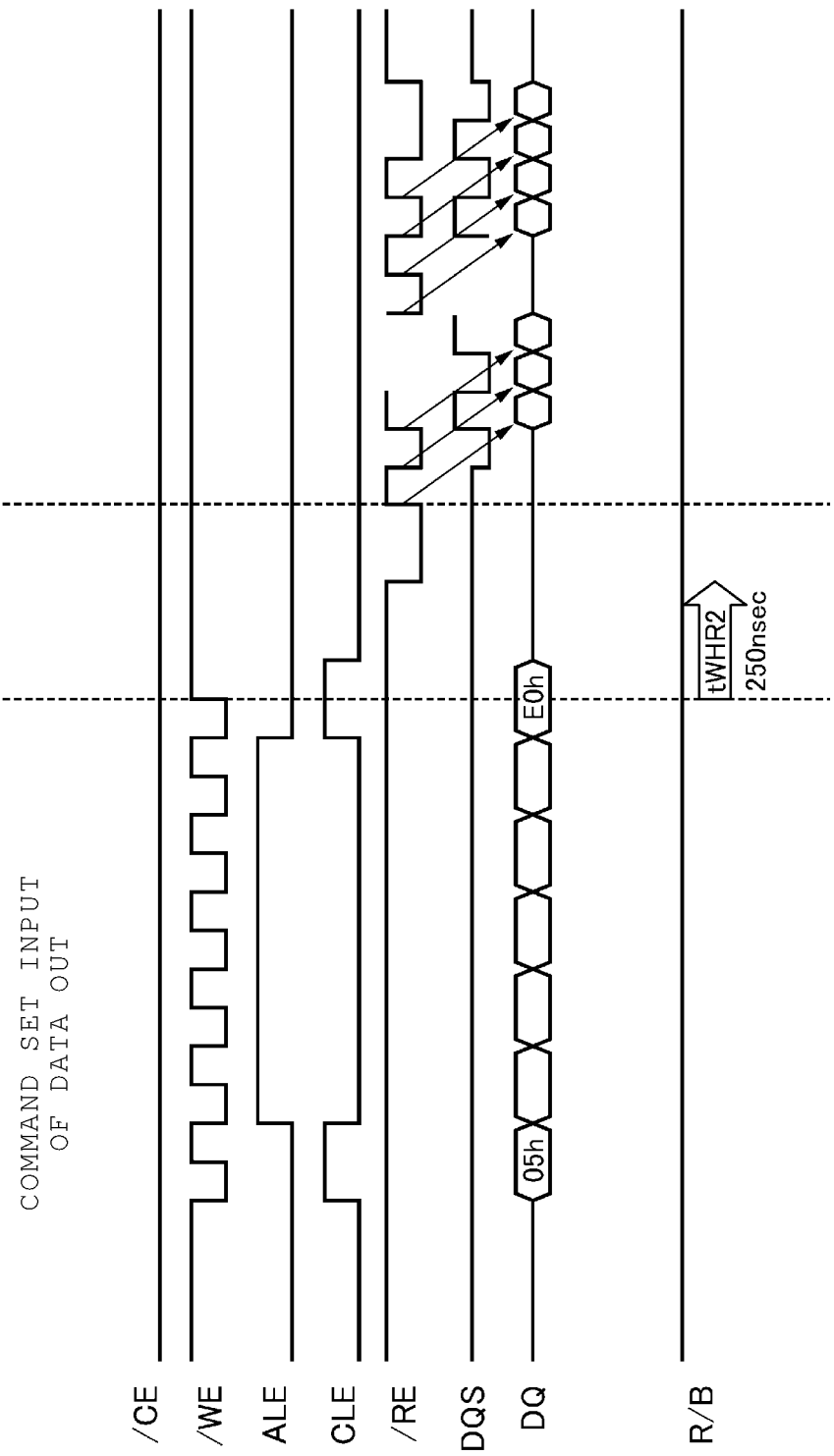
FIG. 10 is a timing chart illustrating a ZQ calibration operation of a semiconductor memory device according to a modification example of the first embodiment.

As illustrated in FIG. 10, when only the data out command set (command 05h-address-command E0h) is input, the sequencer 26 does not execute the ZQ calibration operation. That is, the required period of time tWHR2 (for example, 250 ns) until the output of initial 8-bit data is prepared after receiving the command E0h cannot be replaced with the required period of time tWHR2L (for example, 300 ns).

Figure 11:
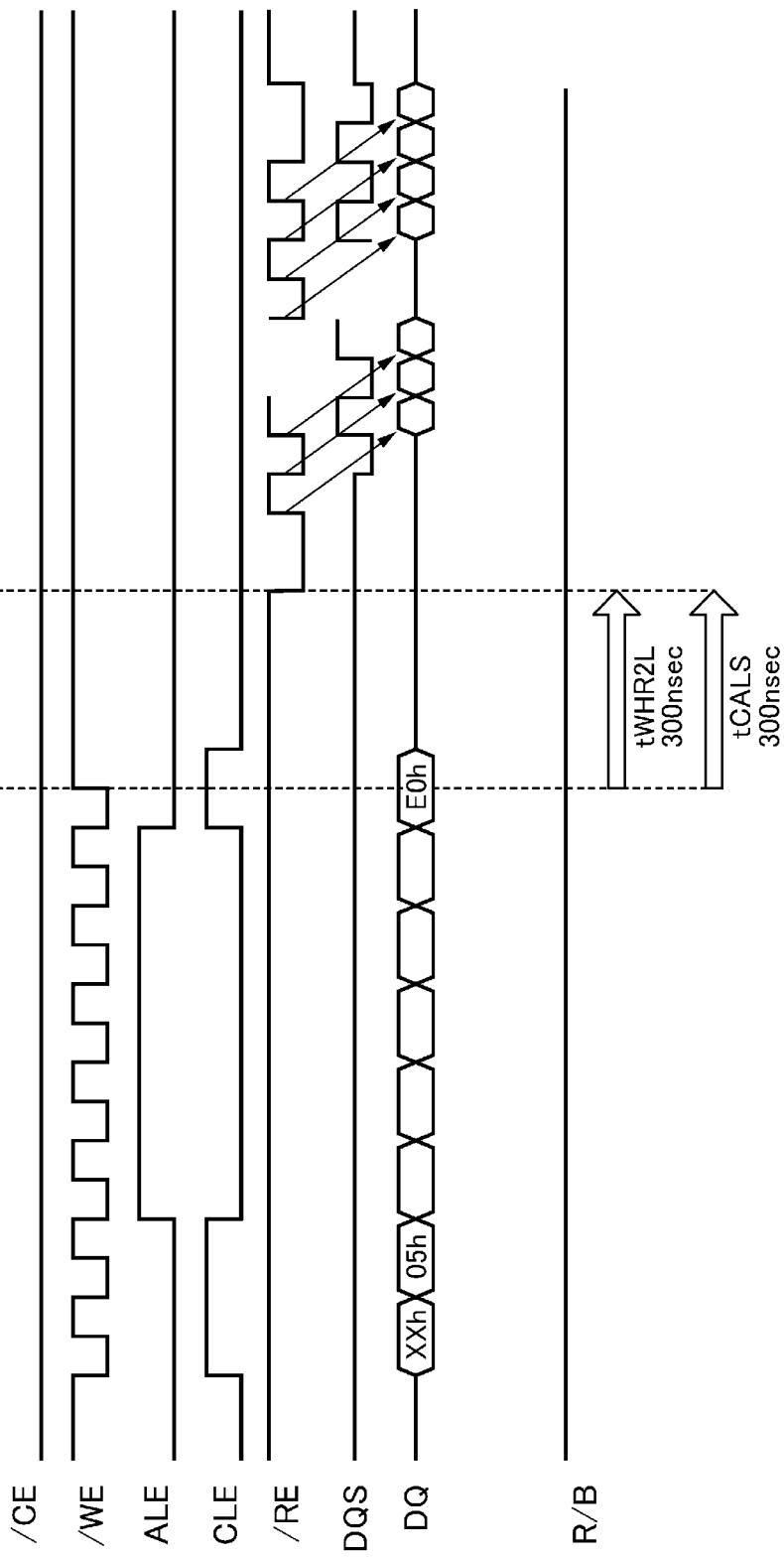
FIG. 11 is a timing chart illustrating the ZQ calibration operation of the semiconductor memory device according to the modification example of the first embodiment.

On the other hand, as illustrated in FIG. 11, when not only the data out command set (command 05h-address-command E0h) but also the prefix command XXh is received, the sequencer 26 executes the ZQ calibration operation.

Specifically, the controller 10 sets the signal /WE to L level, sets the signal CLE to H level, and transmits the prefix command XXh and the command 05h. Next, the controller 10 sets the signal /WE to L level, sets the signal ALE to H level, and transmits an address. After completing the transmission of the column address to be read, the controller 10 sets the signal /WE to L level, sets the signal CLE to H level, and transmits a command E0h.

In the modification example, the ZQ calibration operation is executed in the required period of time until the output of initial 8-bit data is prepared from the input of the command E0h. When the command E0h is received, the sequencer 26 executes the ZQ calibration operation. In addition, the execution time tCALS of the ZQ calibration short is, for example, 300 ns. Therefore, the required period of time tWHR2 (for example, 250 ns) after receiving the command E0h for preparing the output of initial 8-bit data may be replaced with the required period of time tWHR2L (for example, 300 ns).

As described above, the semiconductor memory device 20 according to the embodiment includes: the memory core 25 that includes a memory cell array; the input-output pad group 21 that includes a first pad for inputting and outputting data to and from the memory cell array; the interface circuit 23 that is connected to the first pad; the ZQ pad 22 as a second pad that is different from the first pad; the ZQ calibration circuit 24 that is connected to the second pad and executes ZQ calibration to generate a ZQ calibration value; and the sequencer 26 configured to control the ZQ calibration circuit 24 to apply the ZQ calibration value to the interface circuit 23. A command set is input through the first pad after reading data from the memory cell array to cause the interface circuit 23 to output the data read from the memory cell array, and the ZQ calibration circuit 24 executes the ZQ calibration after the command set is input and before the data is output through the first pad.

In addition, as described above in the modification example, the command set may include the prefix command XXh as an instruction command for an instruction to execute the ZQ calibration. In such a case, when the command set does not include the prefix command XXh, the ZQ calibration circuit 24 does not execute the ZQ calibration.

2. Second Embodiment

2.1 Configuration

Since a configuration of a second embodiment is the same as the configuration of the first embodiment, the description will not be repeated.

2.2 Operation

2.2.1 Regarding ZQ Calibration Operation

Since the ZQ calibration operation of the second embodiment is the same as the ZQ calibration operation of the first embodiment, the description will not be repeated.

2.2.2. Regarding Timing of ZQ Calibration Operation

A timing of the ZQ calibration operation of the second embodiment is as follows. In the embodiment, the input period of the ZQ calibration short instruction command and the execution time of the ZQ calibration short are not necessary. Therefore, a configuration illustrated in FIG. 12 is adopted.

Figure 12:
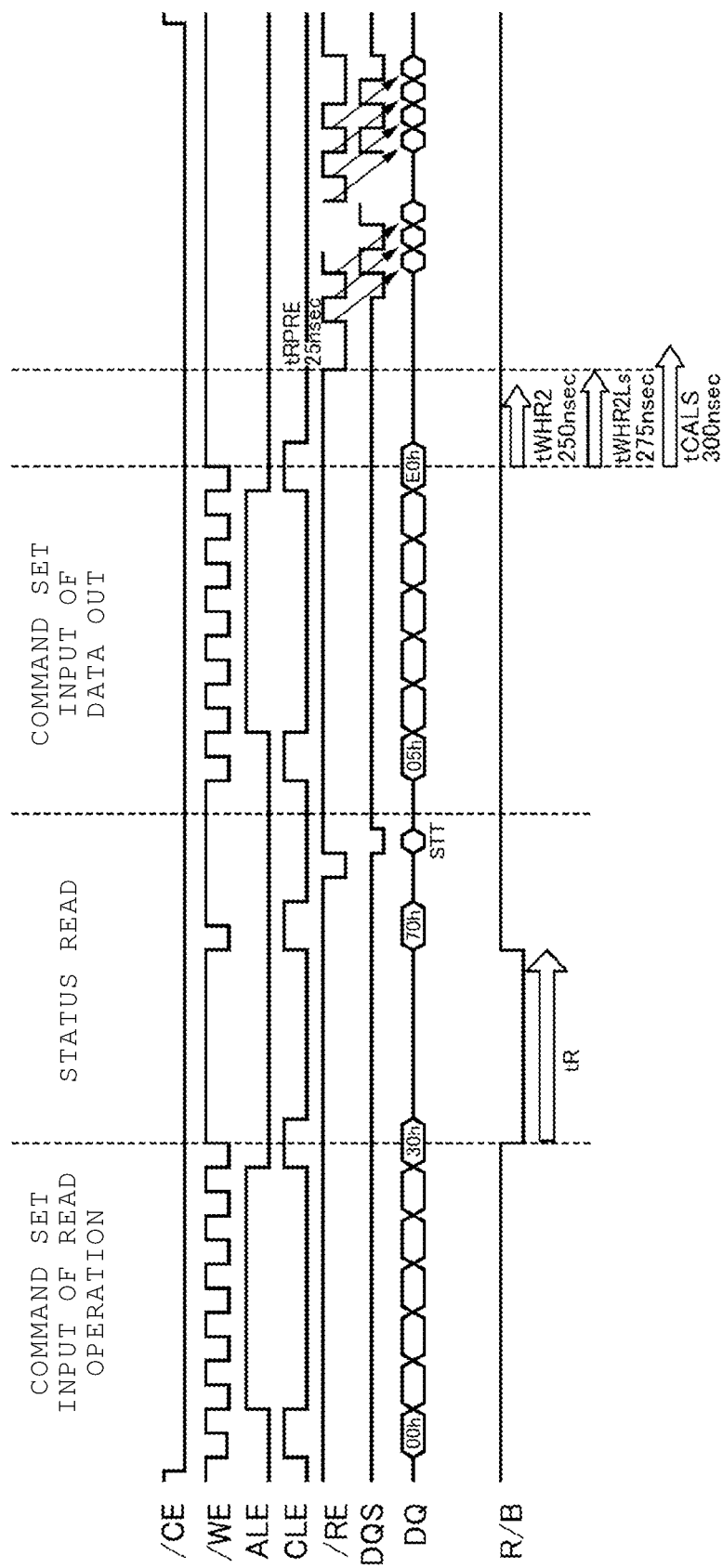
FIG. 12 is a timing chart illustrating a ZQ calibration operation of a semiconductor memory device according to a second embodiment.

As illustrated in FIG. 12, first, a command set of the read operation is input. Specifically, the controller 10 sets the signal /CE0 to L level, and enables the semiconductor memory device 20. Next, the controller 10 sets the signal /WE to L level, sets the signal CLE to H level, and transmits a command 00h. Next, the controller 10 sets the signal /WE to L level, sets the signal ALE to H level, and transmits an address. After completing the transmission of the address to be read, the controller 10 sets the signal /WE to L level, sets the signal CLE to H level, and transmits a command 30h.

Next, the controller 10 transmits the command 30h and starts the read operation. An internal operation such as application of a read voltage is executed such that the semiconductor memory device 20 enters the busy state. Therefore, the sequencer 26 sets the signal R/B0 to L level to notify the controller 10 that the semiconductor memory device 20 is in the busy state. Instead of or in addition to notifying the controller 10 of the ready state, the sequencer 26 may store information representing that the semiconductor memory device 20 is in the busy state in a status register in the register 42. After a required period of time tR for the read operation elapses, the sequencer 26 sets the signal R/B0 to H level to notify the controller 10 that the semiconductor memory device 20 is in the ready state. Instead of or in addition to notifying the controller 10 of the ready state, the sequencer 26 may store information representing that the semiconductor memory device 20 is in the ready state in the status register in the register 42. To instruct the semiconductor memory device 20 to execute the status read operation, the controller 10 sets the signal /WE to L level, sets the signal CLE to H level, transmits a command 70h.

When the controller 10 verifies that the semiconductor memory device 20 is in the ready state, the controller 10 inputs a command set of data out. Specifically, the controller 10 sets the signal /WE to L level, sets the signal CLE to H level, and transmits a command 05h. Next, the controller 10 sets the signal /WE to L level, sets the signal ALE to H level, and transmits an address. After completing the transmission of the column address to be read, the controller 10 sets the signal /WE to L level, sets the signal CLE to H level, and transmits a command E0h.

A required period of time tWHR2 from the input of the command E0h for preparing an initial output of 8-bit data elapses. Further, after a toggle start preparation time tRPRE of the signal /RE and the signal RE elapses, the controller 10 switches (toggles) the signal /RE and the signal RE between L level and H level, switches the signal DQS and the signal /DQS between H level and L level, and executes data out.

In the embodiment, the ZQ calibration operation is executed by using the required period of time tWHR2 and the toggle start preparation time tRPRE. When the command E0h is received, the sequencer 26 executes the ZQ calibration operation. The execution time tCALS of the ZQ calibration short is, for example, 300 ns. Here, the signal /RE and the signal RE are not toggled during the toggle start preparation time tRPRE (for example, 25 ns). Therefore, the required period of time tWHR2 (for example, 250 ns) after receiving the command E0h for preparing the output of initial 8-bit data is replaced with a required period of time tWHR2Ls that is longer than or equal to the execution time tCALS (which is, for example, 300 ns) of the ZQ calibration short minus the toggle start preparation time tRPRE (which is, for example, 25 ns). As a result, the required period of time tWHR2 until the output of initial 8-bit data is prepared after receiving the command E0h can be made to overlap with the operation period of the ZQ calibration short, and an amount of increase in the required period of time tWHR2 can be reduced.

As described above, in the semiconductor memory device 20 according to the second embodiment, the ZQ calibration circuit 24 executes the ZQ calibration even after receiving a signal of a signal output instruction.

3. Third Embodiment

3.1 Configuration

Since a configuration of a third embodiment is the same as the configuration of the first embodiment, the description will not be repeated.

3.2 Operation

3.2.1 Regarding ZQ Calibration Operation

Since a ZQ calibration operation of the third embodiment is the same as the ZQ calibration operation of the first embodiment, the description will not be repeated.

3.2.2. Regarding Timing of ZQ Calibration Operation

A timing of the ZQ calibration operation of the third embodiment is as follows. In the embodiment, the issuance of the command dedicated to the ZQ calibration short is unnecessary, and the execution wait time of the ZQ calibration short is unnecessary. Therefore, a configuration illustrated in FIG. 13 is adopted.

Figure 13:
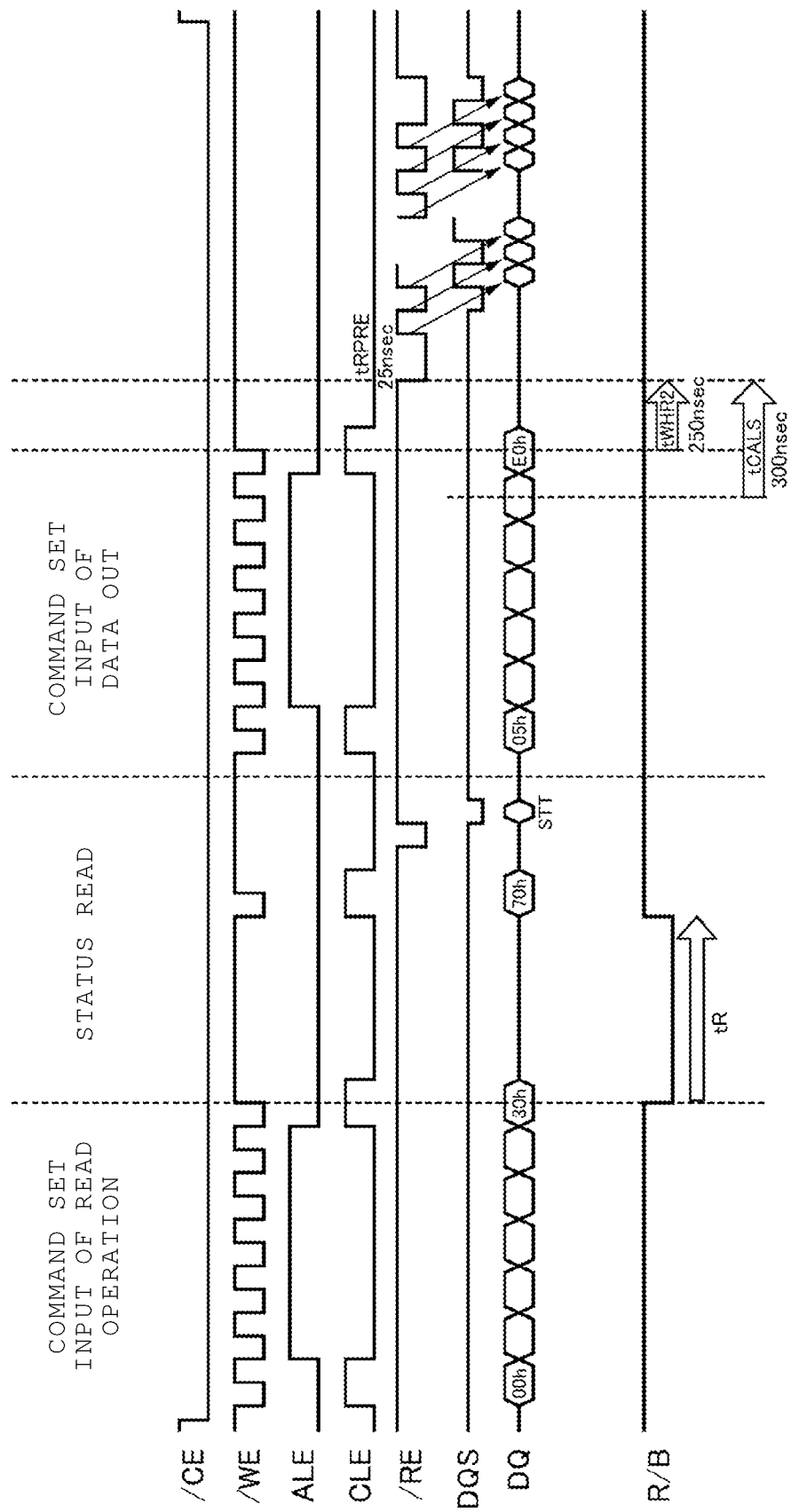
FIG. 13 is a timing chart illustrating a ZQ calibration operation of a semiconductor memory device according to a third embodiment.

As illustrated in FIG. 13, first, a command set of the read operation is input. Specifically, the controller 10 sets the signal /CE0 to L level, and enables the semiconductor memory device 20. Next, the controller 10 sets the signal /WE to L level, sets the signal CLE to H level, and transmits a command 00h. Next, the controller 10 sets the signal /WE to L level, sets the signal ALE to H level, and transmits an address. After completing the transmission of the address to be read, the controller 10 sets the signal /WE to L level, sets the signal CLE to H level, and transmits a command 30h.

Next, the controller 10 transmits the command 30h and starts the read operation. An internal operation such as application of a read voltage is executed such that the semiconductor memory device 20 enters the busy state. Therefore, the sequencer 26 sets the signal R/B0 to L level to notify the controller 10 that the semiconductor memory device 20 is in the busy state. Instead of or in addition to notifying the controller 10 of the ready state, the sequencer 26 may store information representing that the semiconductor memory device 20 is in the busy state in a status register in the register 42. After a required period of time tR for the read operation elapses, the sequencer 26 sets the signal R/B0 to H level to notify the controller 10 that the semiconductor memory device 20 is in the ready state. Instead of or in addition to notifying the controller 10 of the ready state, the sequencer 26 may store information representing that the semiconductor memory device 20 is in the ready state in the status register in the register 42. To instruct the semiconductor memory device 20 to execute the status read operation, the controller 10 sets the signal /WE to L level, sets the signal CLE to H level, transmits a command 70h.

When the controller 10 verifies that the semiconductor memory device 20 is in the ready state, the controller 10 inputs a command set of data out. Specifically, the controller 10 sets the signal /WE to L level, sets the signal CLE to H level, and transmits a command 05h for designating a column address. Next, the controller 10 sets the signal /WE to L level, sets the signal ALE to H level, and transmits an address. After completing the transmission of the column address to be read, the controller 10 sets the signal /WE to L level, sets the signal CLE to H level, and transmits a command E0h of the read operation.

A required period of time tWHR2 from the input of the command E0h for preparing an initial output of 8-bit data elapses. Further, after a toggle start preparation time tRPRE of the signal /RE and the signal RE elapses, the controller 10 switches (toggles) the signal /RE and the signal RE between L level and H level, switches the signal DQS and the signal /DQS between H level and L level, and executes data out.

In the embodiment, the ZQ calibration operation speculatively starts in the middle of receiving the data out command set instead of being executed after completion of the reception of the data out command set (command 05h-address-command E0h). As illustrated in FIG. 13, the ZQ calibration operation is executed after receiving, for example, a column address of the fifth cycle. When the column address of the fifth cycle is received, the sequencer 26 executes the ZQ calibration operation.

The configuration of speculatively starting the ZQ calibration operation is not limited to the configuration described above with reference to FIG. 13. For example, when the command 05h is received, the ZQ calibration operation may be executed. In this case, the ZQ calibration operation is executed simultaneously in all the chips sharing the signal /CE. In this configuration, the on-chip resistance circuit 27 needs to be provided for the reference resistor, and a configuration where the reference resistor is provided outside the chips and is shared between the chips cannot be adopted.

As described above, in the semiconductor memory device 20 according to the third embodiment, the data out command set as the first command set includes the command 05h as the first command, an address, and the command E0h as the second command, and when the address is received, the ZQ calibration circuit 24 executes the ZQ calibration. In addition, in the semiconductor memory device according to the third embodiment, the data out command set as the first command set includes the command 05h as the first command, an address, and the command E0h as the second command, and when the first command is received, the ZQ calibration circuit 24 executes the ZQ calibration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor memory device comprising:
a memory cell array;
a first pad;
an interface circuit that is connected to the first pad and configured to transmit data input through the first pad to the memory cell array and output data received from the memory cell array through the first pad;
a second pad that is different from the first pad;
a ZQ calibration circuit that is connected to the second pad and executes a ZQ calibration to generate a ZQ calibration value; and a sequencer configured to control the ZQ calibration circuit to apply the ZQ calibration value to the interface circuit, wherein a command set is input through the first pad after reading data from the memory cell array to cause the interface circuit to output the data read from the memory cell array, and the ZQ calibration circuit executes the ZQ calibration after the command set is input and before the data is output through the first pad.

2. The semiconductor memory device according to claim 1, wherein the command set includes an instruction command to execute the ZQ calibration.

3. The semiconductor memory device according to claim 2, wherein if another command set, which does not include the instruction command to execute the ZQ calibration, is input through the first pad after reading data from the memory cell array to cause the interface circuit to output the data read from the memory cell array, the ZQ calibration circuit does not execute the ZQ calibration.

4. The semiconductor memory device according to claim 1, further comprising:

a third pad through which a signal output instruction is received, wherein the ZQ calibration circuit executes the ZQ calibration during a period in which the signal output instruction is received through the third pad.

5. The semiconductor memory device according to claim 4, wherein the sequencer, in response to the signal output instruction, controls the interface circuit to output the data read from the memory cell array through the first pad.

6. The semiconductor memory device according to claim 1, wherein the command set includes a first command, an address, and a second command, and the ZQ calibration circuit executes the ZQ calibration upon receiving the second command.

7. A semiconductor memory device comprising:

a memory cell array;

a first pad;

an interface circuit that is connected to the first pad and configured to transmit data input through the first pad to the memory cell array and output data received from the memory cell array through the first pad;

a second pad that is different from the first pad;

a ZQ calibration circuit that is connected to the second pad and executes a ZQ calibration to generate a ZQ calibration value; and a sequencer configured to control the ZQ calibration circuit to apply the ZQ calibration value to the interface circuit, wherein a command set is input through the first pad after reading data from the memory cell array to cause the interface circuit to output the data read from the memory cell array, the command set including a first command, an address, and a second command, and the ZQ calibration circuit executes the ZQ calibration after the first command is input and before the data is output through the first pad.

8. The semiconductor memory device according to claim 7, wherein the command set further includes an instruction command to execute the ZQ calibration.

9. The semiconductor memory device according to claim 8, wherein the instruction command is input before the first command.

10. The semiconductor memory device according to claim 7, further comprising:

a third pad through which a signal output instruction is received, wherein the ZQ calibration circuit executes the ZQ calibration during a period in which the signal output instruction is received through the third pad.

11. The semiconductor memory device according to claim 10, wherein the sequencer, in response to the signal output instruction, controls the interface circuit to output the data read from the memory cell array through the first pad.

12. The semiconductor memory device according to claim 7, wherein the ZQ calibration circuit executes the ZQ calibration upon receiving the second command.

13. The semiconductor memory device according to claim 7, wherein the ZQ calibration circuit begins executing the ZQ calibration prior to receiving the second command.

14. The semiconductor memory device according to claim 13, wherein the ZQ calibration circuit begins executing the ZQ calibration while receiving the address.

15. A memory system comprising:

a semiconductor memory device including a memory cell array; and a controller configured to control the semiconductor memory device to perform operations by issuing command sets thereto, wherein the command sets include first and second command sets to read data from the memory cell array and output the data read from the memory cell array to the controller, wherein the first command set is issued to read the data from the memory cell array, and the second command set is issued to output the data read from the memory cell array, the second command set including a first command, and address, and a second command, and the semiconductor memory device executes a ZQ calibration after receiving the first command from the controller and before outputting the data to the controller.

16. The memory system according to claim 15, wherein the second command set further includes an instruction command to execute the ZQ calibration.

17. The memory system according to claim 16, wherein the instruction command is issued before the first command.

18. The memory system according to claim 17, wherein the semiconductor memory device executes the ZQ calibration during a period in which the controller issues a signal output instruction after issuing the second command set.

19. The memory system according to claim 15, wherein the semiconductor memory device executes the ZQ calibration upon receiving the second command.

20. The memory system according to claim 15, wherein the semiconductor memory device begins executing the ZQ calibration while receiving the address.

* * * * *